US011630170B2

(12) United States Patent
Hughes et al.

(10) Patent No.: US 11,630,170 B2
(45) Date of Patent: Apr. 18, 2023

(54) OPTICALLY-PUMPED MAGNETOMETER (OPM) WITH AN OPM CONNECTOR THAT MITIGATES ELECTROSTATIC DISCHARGE (ESD) AND STORES OPM OPERATIONAL DATA

(71) Applicant: FieldLine Inc., Boulder, CO (US)

(72) Inventors: Kenneth Jeramiah Hughes, Lafayette, CO (US); Tyler Louis Maydew, Superior, CO (US); Orang Alem, Lafayette, CO (US)

(73) Assignee: FieldLine Inc., Boulder, CO (US)

( * ) Notice: Subject to any disclaimer, the term of this patent is extended or adjusted under 35 U.S.C. 154(b) by 154 days.

(21) Appl. No.: 17/320,812

(22) Filed: May 14, 2021

(65) Prior Publication Data

US 2021/0356537 A1 Nov. 18, 2021

Related U.S. Application Data

(60) Provisional application No. 63/025,769, filed on May 15, 2020.

(51) Int. Cl.
*G01R 33/26* (2006.01)
*G01R 33/24* (2006.01)

(52) U.S. Cl.
CPC ............. *G01R 33/26* (2013.01); *G01R 33/243* (2013.01)

(58) Field of Classification Search
CPC ..................... G01R 33/26; G01R 33/243
See application file for complete search history.

(56) References Cited

U.S. PATENT DOCUMENTS

2020/0341081 A1\* 10/2020 Mohseni ............... G01R 33/26

\* cited by examiner

*Primary Examiner* — Susan S Lee

(57) ABSTRACT

An Optically Pumped Magnetometer (OPM) system is configured to characterize a magnetic field. The OPM system comprises an OPM sensor that is coupled to an OPM cable that is coupled to an OPM connector that is detachably coupled to an OPM controller. The OPM connector stores OPM operational data. The OPM controller reads the OPM operational data when the OPM connector is coupled to an OPM controller. The OPM controller generates sensor control signals based on the OPM operational data and transfers the control signals to the OPM sensor. The OPM sensors characterize the magnetic field in response to the sensor control signals and transfer output signals that characterize the magnetic field to the OPM controller. The OPM controller models the magnetic field based on the output signals and transfers new OPM operational data to OPM connector. The OPM connector stores the new OPM operational data in the memory.

20 Claims, 11 Drawing Sheets

OPTICALLY-PUMPED MAGNETOMETER (OPM) WITH AN OPM CONNECTOR THAT MITIGATES ELECTROSTATIC DISCHARGE (ESD) AND STORES OPM OPERATIONAL DATA

CROSS-REFERENCE TO RELATED APPLICATIONS

This United States Patent application claims priority to U.S. Provisional Patent Application 63/025,769 that was filed on May 15, 2020 and is entitled "OPTICALLY-PUMPED MAGNETOMETER (OPM) WITH AN OPM CONNECTOR THAT MITIGATES ELECTROSTATIC DISCHARGE (ESD) AND STORES OPM OPERATIONAL DATA". U.S. Provisional Patent Application 63/025,769 is hereby incorporated by reference into this United States Patent Application.

TECHNICAL BACKGROUND

Optically-Pumped Magnetometers (OPMs) detect and characterize target magnetic fields. The OPM has OPM sensors to detect and characterize the target magnetic fields. The OPM sensors transfer corresponding OPM signals over OPM cables and OPM connectors to an OPM controller. The OPM controller processes the OPM signals to build a model of the target magnetic field. An individual OPM sensor, OPM cable, and OPM connector are coupled together in a permanent configuration. The OPM connectors are coupled to the OPM controller through a detachable interface like a pins and sockets. Unfortunately, the OPM cables and the OPM connectors store unwanted energy and deliver undesirable Electrostatic Discharge (ESD) to the OPM sensors. The ESD damages lasers and other delicate electronics in the OPM sensors. Moreover, the OPM sensors and the OPM controller are modular, and different OPM sensors may be used by different OPM controllers or controller cards. The modularity of the OPM sensors and the OPM controllers causes the operator to externally track OPM sensor data to customize the performance of the OPM sensors when different OPM sensors are coupled to different OPM controllers.

TECHNICAL OVERVIEW

An Optically Pumped Magnetometer (OPM) system is configured to characterize a magnetic field. The OPM system comprises an OPM sensor that is coupled to an OPM cable that is coupled to an OPM connector that is detachably coupled to an OPM controller. The OPM connector stores OPM operational data in a memory. The OPM controller reads the OPM operational data from the memory in the OPM connector when the OPM connector is coupled to an OPM controller. The OPM controller generates sensor control signals based on the OPM operational data and transfers the control signals to the OPM sensor over the OPM connector and the OPM cable. The OPM sensors characterize the magnetic field in response to the sensor control signals and transfer output signals that characterize the magnetic field to the OPM controller over the OPM cable and the OPM connector. The OPM controller models the magnetic field based on the output signals and transfers new OPM operational data to OPM connector. The OPM connector stores the new OPM operational data in the memory.

TECHNICAL DESCRIPTION

Figure 1:
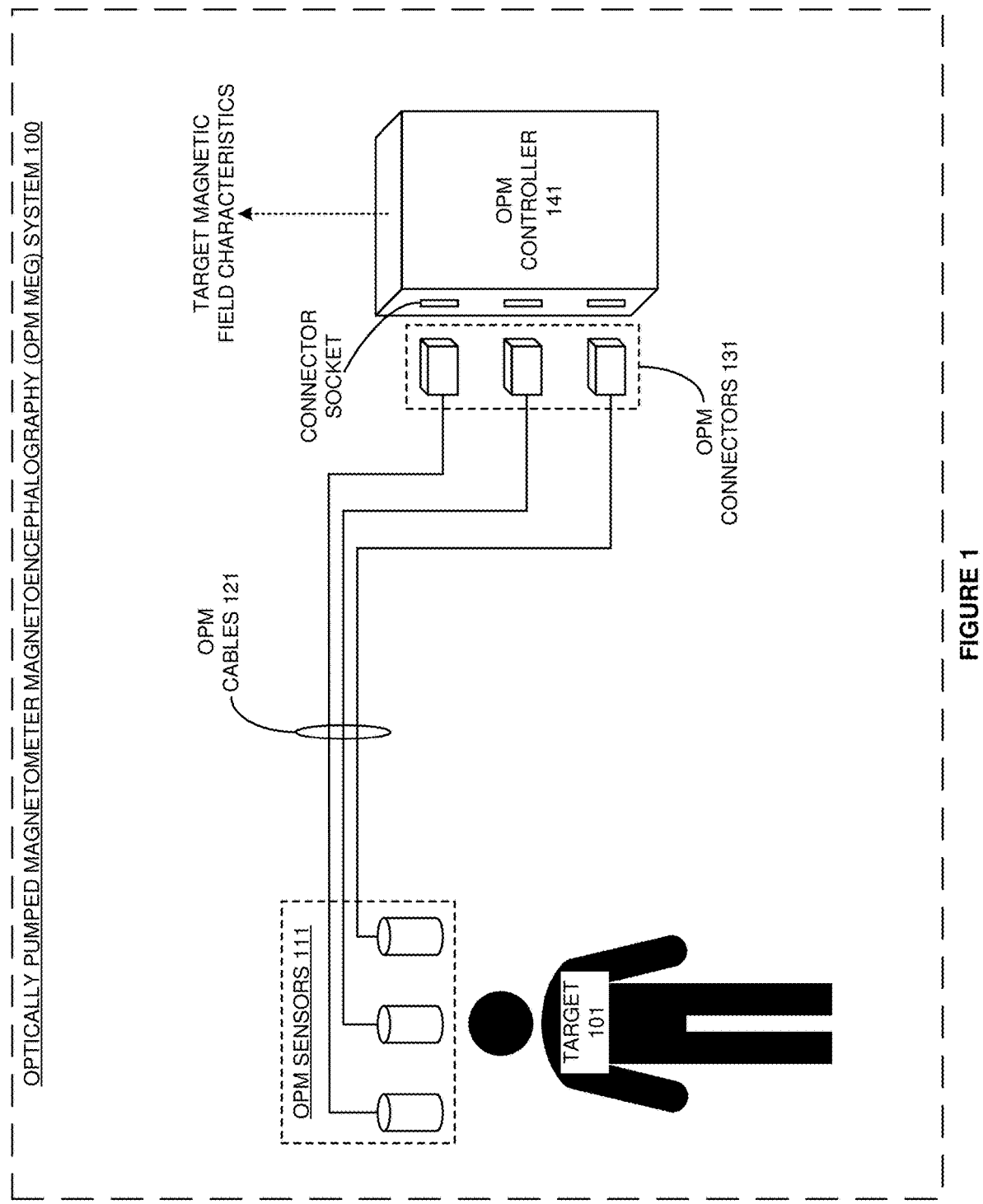
FIG. 1 illustrates an Optically Pumped Magnetometer Magnetencephalography (OPM MEG) system to characterize a magnetic field.

FIG. 1 illustrates Optically-Pumped Magnetometer Magnetoencephalography (OPM MEG) system 100. OPM MEG system 100 comprises target 101, OPM sensors 111, OPM cables 121, OPM connectors 131, and OPM controller 141. OPM MEG system 100 characterizes a magnetic field emitted by target 101. OPM sensors 111 are coupled to OPM cables 121 that are coupled to OPM connector 131. OPM connectors 131 are detachably coupled to OPM controller 141. OPM connectors 131 are shown in an uncoupled state, but OPM connectors 131 are coupled to OPM controller 141 during operation. For example, a human may plug a plastic housing with internal metallic wiring into a connector socket of a card in OPM controller 141.

Various examples of network operation and configuration are described herein. In some examples, relays in OPM connectors 131 connect metallic links in OPM connectors 131 that are coupled to lasers in OPM sensors 111. The metallic links may comprise switches, spring-loaded contacts, transistors, and/or other types of metallic interfaces. OPM connectors 131 detachably couple to OPM controller 141. The relays in OPM connectors 131 receive control signals from OPM controller 141 when OPM connectors 131 are coupled to OPM controller 141. The relays disconnect the metallic links in OPM connectors 131 in response to the control signal from the OPM controller 141. For example, the relays may disconnect the metallic links in OPM connectors 131 in response to the insertion of OPM connectors 131 into OPM controller 141. OPM connectors 131 store OPM operational data in their memory. OPM controller 141 reads the OPM operational data from the memory in OPM connectors 131 when OPM connectors 131 are coupled to OPM controller 141. OPM controller 141 generates sensor control signals based on the OPM operational data. OPM controller 141 transfers the control signals to OPM sensors 111 over OPM connectors 131 and OPM cables 121. OPM sensors 111 characterize the magnetic field in response to the sensor control signals. OPM sensors 111 transfer output signals that characterize the magnetic field to OPM controller 141 over OPM cables 121 and OPM connectors 131. OPM controller 141 models the magnetic field based on the output signals. For example, OPM controller 141 may ingest the output signals from OPM sensors 111 and model the magnetic field at the location of OPM sensors 111 and transfer the model to downstream systems. For example, OPM controller 141 may build and maintain a three-dimensional model of the target magnetic field. OPM controller 141 transfers new OPM operational data to OPM connectors 131. OPM connectors 131 store the new OPM operational data in their memory. OPM connectors 131 detach from OPM controller 141. The relays in OPM connectors 131 connect the metallic links that are coupled to the laser in OPM sensors 111 in response to the loss of the control signal from OPM controller 141. For example, the relays may connect the metallic links in OPM connectors 131 in response to the decoupling of OPM connectors 131 from OPM controller 141.

Advantageously, OPM connectors 131 store OPM operational data to reduce or eliminate external data that is used by OPM controller 141 to customize the operation of OPM sensors 111. Moreover, OPM connectors 131 mitigate Electrostatic Discharge (ESD) from developing and reaching OPM sensor 111 by shorting metallic links when OPM sensors 111 are not operating.

Target 101 is depicted as a human being, however, target 101 may comprises any magnetic field source. Target 101 emits magnetic waves that form a target magnetic field. OPM sensors 111 comprises lasers, coils, vapor cells, photo detectors, heaters, bus circuitry, and the like. OPM sensors 111 are positioned in the target magnetic field and detect the target magnetic field to generate signals that individually characterize the target magnetic field. OPM cables 121 comprise sheathed metal wires that transfer signaling between OPM sensors 111 and OPM connectors 131. OPM connectors 131 comprise relays, memory, metallic interfaces, bus circuitry, and the like. OPM controller 141 comprises microprocessors, software, memories, metallic interfaces, bus circuitry, and the like. The microprocessors comprise Field Programmable Gate Arrays (FPGAs), Digital Signal Processors (DSP), Application-Specific Integrated Circuits (ASIC), and/or the like. The memories comprise flash circuitry, disk drives, and/or the like. The memories store software like operating systems, sensor applications, and magnetic field processing functions. The microprocessors retrieve the software from the memories and execute the software to drive the operation of OPM MEG system 100 as described herein.

Figure 2:
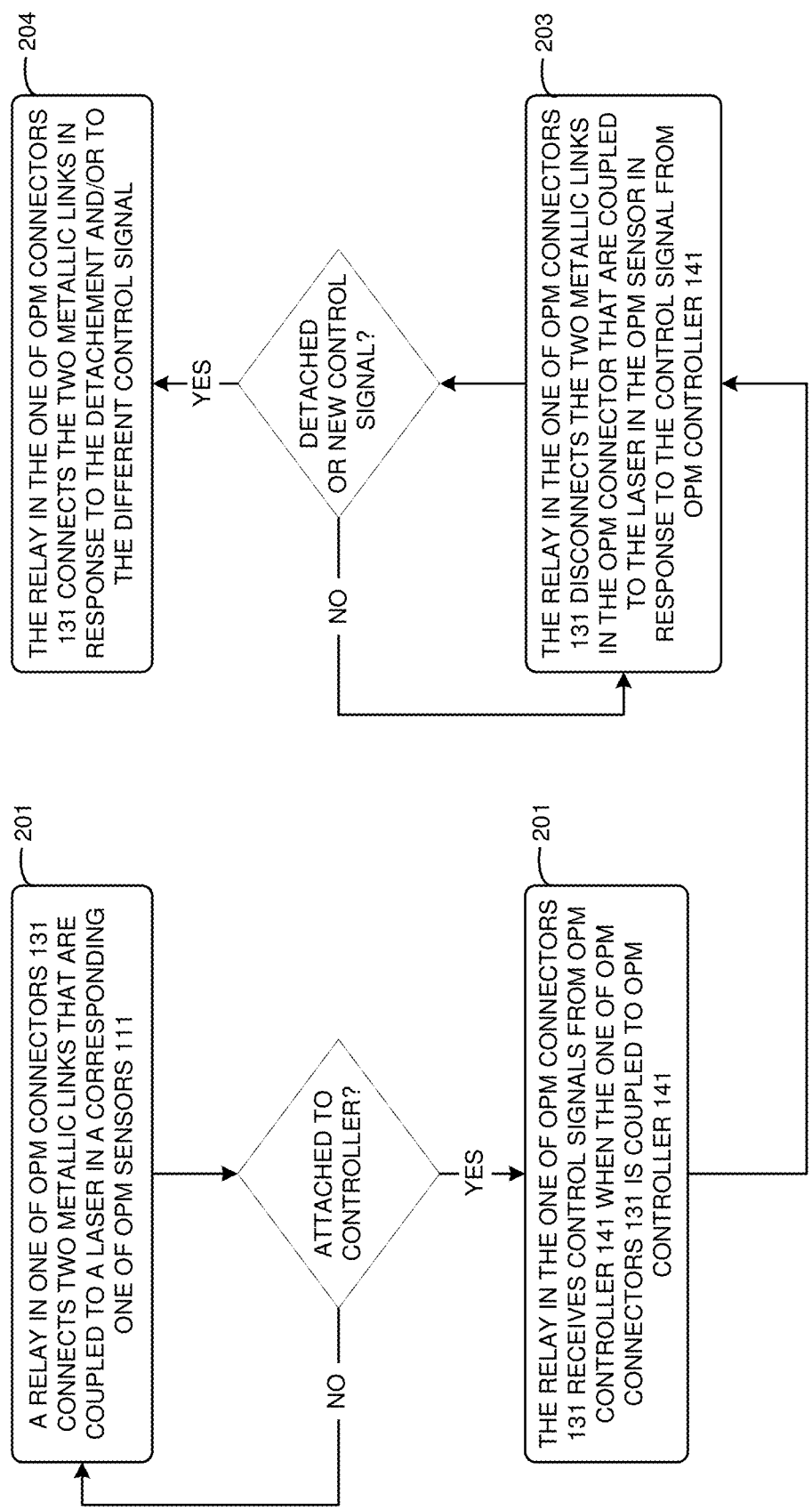
FIG. 2 illustrates an exemplary operation of the OPM MEG system to characterize the magnetic field.

FIG. 2 illustrates an exemplary operation of OPM MEG system 100 to characterize the magnetic field. The operation may differ in other examples. A relay in one of OPM connectors 131 connects two metallic links that are coupled to a laser in a corresponding one of OPM sensors 111 (201). The corresponding one of OPM sensors 111 is coupled to the one of OPM connectors 131 over a cable of OPM cables 121. If the one of OPM connectors 131 is not attached to OPM controller 141, the relay continues to connect the two metallic links. If the one of OPM connectors 131 is attach to OPM controller 141, the process proceeds to step 202. The relay in the one of OPM connectors 131 receives control signals from OPM controller when the one of the OPM connectors 131 is coupled to OPM controller 141 (202).

In response to the control signal from OPM controller 141, the relay in the one of the OPM connectors 131 disconnects the two metallic links in the OPM connector that are coupled to the laser in the OPM sensor (203). Disconnecting the two metallic links allows OPM controller 141 to communicate with the corresponding one of OPM sensors 111. If the one of OPM connectors 131 remains connected to OPM controller 141 or does not receive any new control signaling, then the relay continues to disconnect the two metallic links. If the one of OPM connectors 131 detaches from OPM controller 141 or receives different control signals, then the operation proceeds to step 204. The relay in the one of OPM connectors 131 connects the two metallic links in response to the detachment and/or the different control signal (204). For example, the relay may connect to the two metallic links to short the metallic links to prevent the buildup of Electrostatic Discharge (ESD) in the one of the OPM connectors 131 when it is disconnected. For example, the relay may connect to the two metallic links to short the metallic links to prevent the buildup of ESD in the one of the OPM connectors 131 when the relay receives a control signal from OPM connector 141 that directs the relay to connect the two metallic links.

Figure 3:
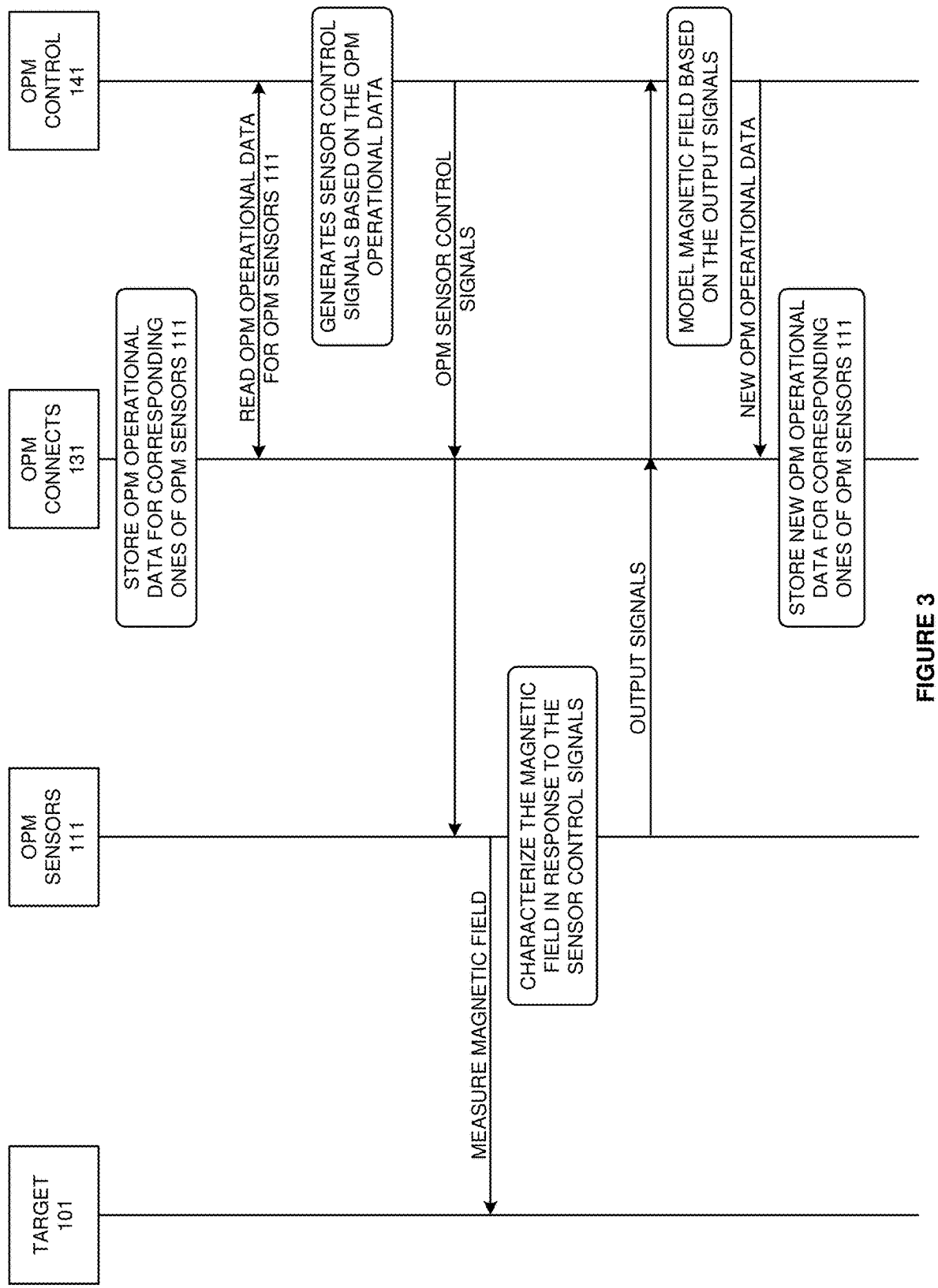
FIG. 3 illustrates another exemplary operation of the OPM MEG system to characterize the magnetic field.

FIG. 3 illustrates another exemplary operation of OPM MEG system 101 to characterize the magnetic field. The operation may differ in other examples. OPM connectors 131 store OPM operational data in their memory for corresponding ones of OPM sensors 111. For example, an OPM connector of OPM connectors 131 may store OPM operational data for an OPM sensor of OPM sensors 111 that it is connected to over one of OPM cables 121. OPM controller 141 reads the OPM operational data for OPM sensors 141 from OPM connectors 131. OPM controller 141 generates sensor control signals for OPM sensors 111 based on the OPM operational data. OPM controller 141 transfers the sensor control signals to OPM sensors 111 over OPM connectors 131 and OPM cables 121. In response to the control signals, OPM sensors 111 measure and characterize the magnetic field emitted by target 101. OPM sensors 111 transfer output signals that indicate the measured magnetic field over OPM cables 121 and OPM connectors 131 to OPM controller 141. OPM controller 141 models the magnetic field of target 101 based on the output signals. OPM controller 141 generates new OPM operational data for OPM sensors 111 based on the output signals. OPM controller 141 transfers the new OPM operational data to OPM connectors 131. OPM connectors 131 store the new OPM operational data for OPM sensors 111 in memory.

Figure 4:
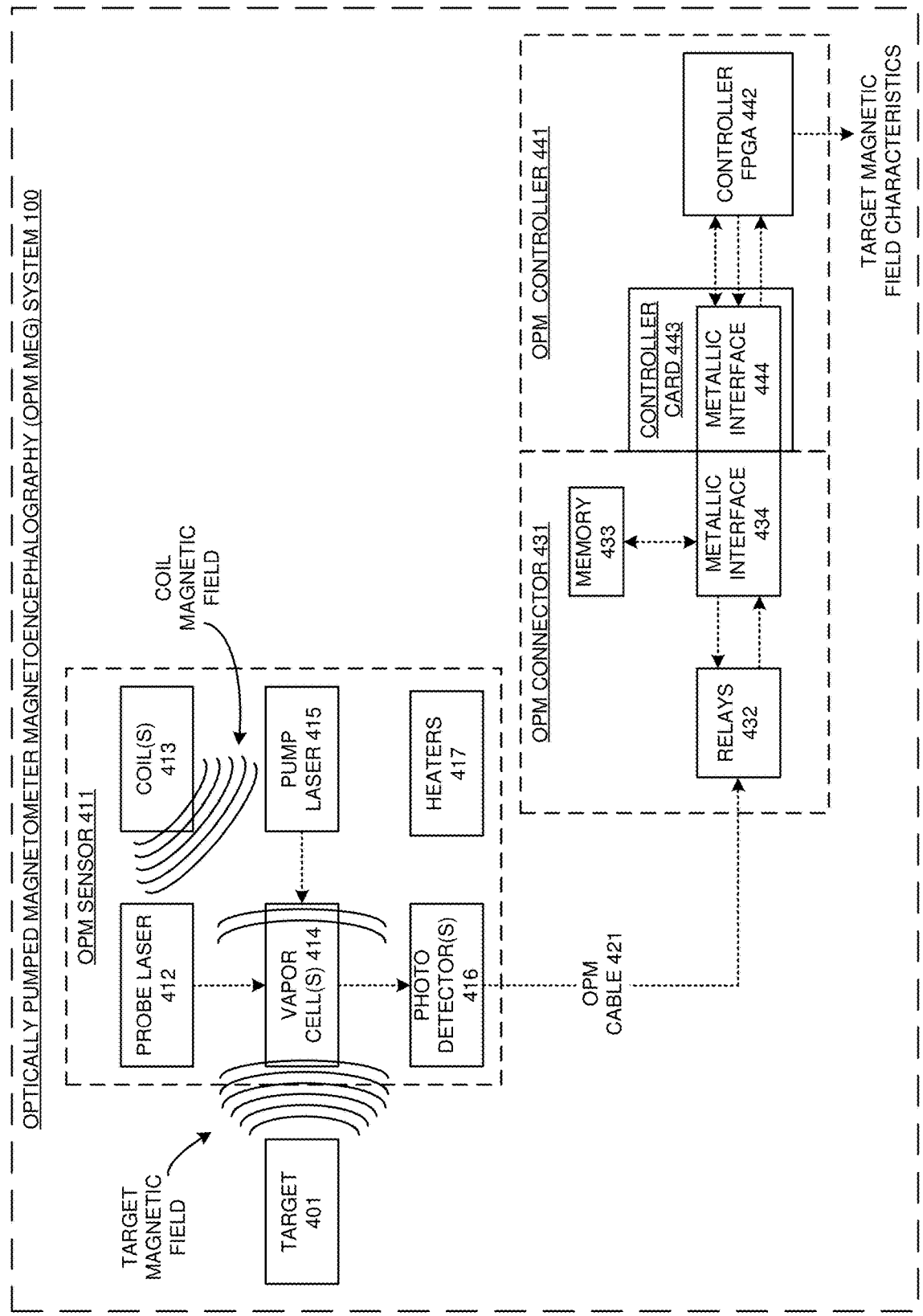
FIG. 4 illustrates an OPM MEG system to characterize a magnetic field.

FIG. 4 illustrates Optically-Pumped Magnetometer Magnetoencephalography (OPM MEG) system 400 to characterize a magnetic field. OPM MEG system 400 comprises an example of OPM MEG system 100, however OPM MEG system 100 may differ. OPM MEG system comprises target 401, OPM sensor 411, OPM cable 421, OPM connector 431 and OPM controller 441. Target 401 is magnetically linked to OPM sensor 411. OPM sensor 411 is metallically linked to OPM cable 421 which is metallically linked to OPM connector 431. OPM connector 431 is detachably coupled to OPM controller 441. Typically, more OPM sensors, cables, and connectors are coupled to the OPM controller but they are omitted for clarity. OPM cable 421 has a ground shield that is coupled to the ground in OPM sensor 411 and to the ground in OPM connector 431. The ground in OPM connector 431 is coupled to the ground in the controller card in OPM controller 441 which is grounded through OPM controller 441.

OPM sensor 411 comprises probe laser 412 and pump laser 415, although the two lasers may be combined, or additional lasers might be used. OPM sensor 411 comprises one or more of coils 413, vapor cells 414, photodetectors 416, and heaters 417. OPM sensor 411 may include signal processors and other electronics but they are omitted in this example. OPM controller 441 comprises controller Field Programmable Gate Array (FPGA) 442, processing card 443, and metallic interface 444. OPM connector 431 comprises metallic interface 434. Metallic interface 434 in the OPM connector 431 is compatible with metallic interface 444 of controller card 443 in OPM controller 441. For example, metallic interface 434 may comprise a male metallic interface and metallic interface 444 may comprise a compatible female metallic interface. Metallic interfaces 434 and 444 comprise pins and sockets or some other metallic coupling. Metallic interfaces 434 and 444 may have housings, where one housing has a protrusion and the other housing has a corresponding notch to align the interfaces during the coupling process.

OPM connector 431 has one or more of relays 432. One of the relays of relays 432 in OPM connector 431 is configured in a normally closed state that shorts the wires that are connected through OPM cable 421 to probe laser 412. Another relay of relays 432 may normally short the wires to pump laser 415. Other relays of relays 432 may normally short wiring to other sensor components like coils 413, photodetectors 416, and heaters 417. Controller FPGA 442 has a control interface to relays 432 through metallic interfaces 434 and 444. FPGA 442 signals relays 432 to open when lasers 412 and 415 and other components in OPM sensor 411 are needed for operation. FPGA 442 may open relays 432 individually or as a group. Controller FPGA 442 may open relays 432 in response to power-up, OPM connector detection, operational sequence, or some other trigger. Relays 432 disconnect the shorted wiring in response to FPGA 442 control signaling. Relays 432 automatically close and re-short the wiring when OPM connector 431 is unplugged from OPM controller 441 because the control signal from FPGA 442 is lost.

In some examples, OPM cable 421 has additional OPM connectors (in addition to OPM connector 431) between OPM controller 441 and OPM sensor 411. The additional connectors may have relays and/or memories that are configured and operate as described above. The additional OPM connectors may couple to each other or to a common interface in a similar manner to OPM connector 431 and OPM controller card 443. The additional connectors may couple to a common interface in the wall of a magnetically-shielded room that contains target 401, OPM sensor 411, OPM cable 421, and OPM connector 431. Thus, the memory and/or the relay could be located in the cable, a fob in the cable, or the sensor in some examples.

OPM connector 431 has at least one of memory 433. Memory 433 comprises storage systems like flash circuitry. Controller FPGA 442 writes and reads OPM operational data to and from memory 433 when OPM connector 431 is coupled to controller card 443. The OPM operational data includes an ID, configuration parameters, and performance characteristics of OPM sensor 411. For example, memory 433 may store OPM sensor operating points for OPM sensor 411 that were determined during OPM sensor diagnostics and testing. The OPM operational data could be servo Proportional-Integral-Derivative (PID) values for lasers 412 and 415. The OPM operational data could be laser resonant currents, heater power values, laser modulation frequencies, cell resonant frequency, and the like. The OPM operational data could indicate component usage time, customer data, help information, or some other OPM information. The OPM operational data could include configuration data like number and type of lasers, heaters, coils, and photodetectors—along with their interconnections and sensor architecture. The OPM operational data could include cell rubidium level, cell pressure, build history and notes. The OPM operational data may comprise laser lock parameters like lock currents, temperatures, and voltages. The OPM operational data may comprise diode drop voltages for resonance at various temperatures.

In operation, OPM connector 431 couples to OPM controller 441. OPM controller 441 responsively controls relays 432 to open the shorted wiring to OPM sensor 411. OPM controller 441 reads the memory of OPM connector 431 to identify OPM operational data for OPM sensor 411. OPM controller 441 inserts the OPM operational data into its processing software. OPM controller 441 executes the processing software with the OPM operational data to generate control signals for OPM sensor 411. For example, OPM controller 441 may read a diode drop value from OPM connector 431 and use the diode drop value to control heater 417 that warms vapor cells 414. OPM controller 441 may read a laser current value from OPM connector 431 and use the laser current value to control lasers 412 and 415 that pump and probe vapor cells 414. OPM controller 441 transfers the control signals to OPM sensor 411 over OPM connector 431 and OPM cable 421.

OPM sensor 411 operates in response to the control signals from OPM controller 441. Target 401 emits magnetic waves that form a magnetic field. Vapor cells 414 are positioned in the target magnetic field. Vapor cells 414 contain an alkali metal vapor like rubidium. Alternative cells with alkalis, helium, and nitrogen-vacancy centers could be used instead of or along with vapor cells 414. Vapor cells 414 are heated by heaters 417 and biased by coils 413. Pump laser 415 emits a pump beam that is circularly polarized at a resonant frequency of the vapor in vapor cells 414 to polarize the atoms. Probe laser 412 emits a probe beam that is linearly polarized at a non-resident frequency of the vapor in vapor cells 414 to probe the atoms. The probe beam enters vapor cells 414 where quantum interactions with the atoms in the presence of the target magnetic field alter the energy/frequency of probe beam by amounts that correlate to the target magnetic field.

Photodetectors 416 detect the probe beam after these alterations by the vapor atoms responsive to the target magnetic field. Photodetectors 416 generate and transfer corresponding analog electronic signals that characterize the target magnetic field. In some examples, signal processors may filter, amplify, digitize, or perform other tasks on the analog electronic signals. Photodetectors 416 or the signal processors transfer an electronic signal that carries the data over OPM cable 421 to OPM connector 431. OPM connector 431 transfers the electronic signal that characterizes the target magnetic field over to OPM controller 441. OPM controller 441 processes the electronic signal to generate and transfer data that more fully characterizes the target magnetic field. OPM controller 441 typically processes OPM data from multiple OPMs to model the target magnetic field in three dimensions. OPM controller 441 transfers the OPM output data to downstream systems.

OPM controller 441 writes OPM operational data to memory 433 in OPM connector 431. For example, OPM controller 441 may update OPM operational data like component usage time for the lasers, heaters, coils, cell, photodetector, and the like. OPM connector 431 stores the OPM data updates in memory 433. OPM connector 431 detaches from OPM controller 441. In response, relays 432 automatically short the wiring when detached from OPM controller 441.

In some examples, relays 432 may detect the coupling of OPM connector 431 to OPM controller 441 and open the normal short between the wiring without the control signal from OPM controller 441. In other examples, relays 432 could be replaced by switches, transistors, or another type of device that couples and uncoupled the wiring in response to OPM controller attachment and/or OPM sensor operation in a similar manner to relays 432. In some examples, relays 432 and memory 433 may be integrated into OPM sensors 411. In this configuration, relays 432 and memory 433 operate in a manner similar to the operation of memory 433 and relays 432 as described above.

Figure 5:
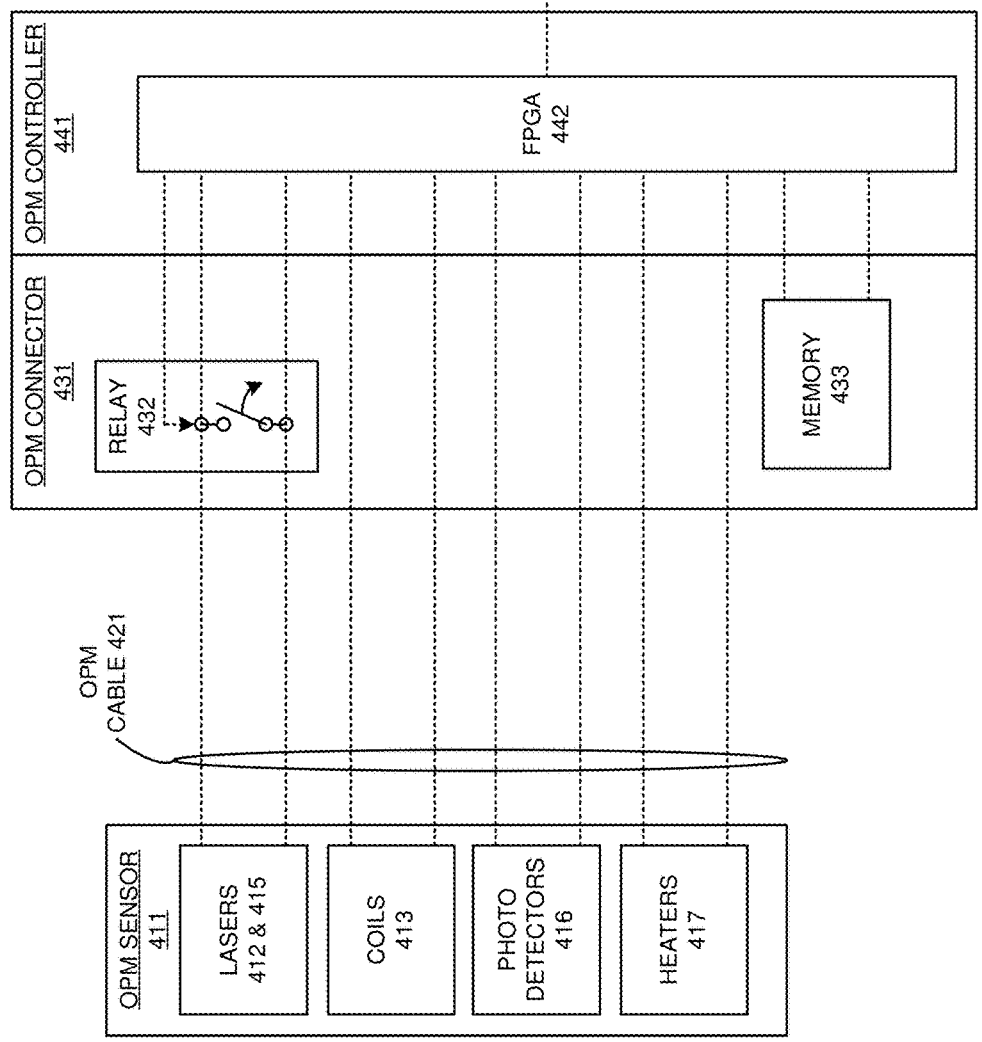
FIG. 5 illustrates an OPM sensor, OPM cable, OPM connector, and OPM controller in the OPM MEG system.

FIG. 5 illustrates OPM sensor 411, OPM cable 421, OPM connector 431, and OPM controller 441 in OPM MEG system 400. OPM sensor 411 is coupled to OPM connector 431 by OPM cable 421. OPM connector 431 is coupled to OPM controller 441. FPGA 442 in OPM controller 441 reads and writes OPM operational data from and to memory 433 in OPM connector 431 when OPM connector 431 is plugged into the OPM controller 441.

FPGA 442 in OPM controller 441 is coupled to lasers 412 and 415, coils 413, photodetectors 416, and heater 417 in OPM sensor 411 by wire pairs that traverse OPM connector 431 and OPM cable 421. Typically, OPM sensor 411 is coupled to OPM controller 441 over seven pairs of wires that travers OPM cable 421, however, other connection arrangements are possible. For example, some components of OPM sensor 411 may share a wire to communicate with OPM controller 441. Relay 432 in the OPM connector 431 normally shorts the wire pair to lasers 412 and 415. Relay 432 is controlled by FPGA 442 in OPM controller 441. FPGA 442 in OPM controller 441 drives relay 432 to open the short when lasers 412 and 415 are operational. Relay 432 in OPM connector 431 automatically shorts the wire pair when the drive signal from FPGA 442 is not present—like when OPM connector 431 is unplugged from OPM controller 441. In some examples, FPGA 442 could be replaced and/or augmented by a Digital Signal Processor (DSP), Application Specific Integrated Circuit (ASIC), or some other type of microprocessor.

In some examples, OPM connector 431 could be adapted for use with other atomic sensors like atomic clocks. For example, an atomic clock sensor may be coupled to an atomic clock controller by an atomic clock cable with a connector. The atomic clock cable connector could include a relay and/or memory that are configured and operate like the relay and/or memory in OPM connector 431. The atomic clock controller could control the relay and/or read/write to the memory like OPM controller 431. In some examples, relay 432 and memory 433 may instead be located in OPM sensor 411. In this configuration, relay 432 and memory 433 operate in a manner similar to the operation described above.

Figure 6:
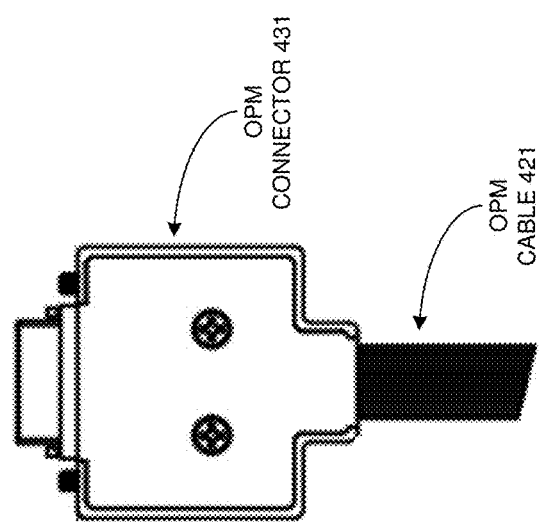
FIGS. 6-8 illustrate an OPM connector in the OPM MEG system.
Figure 7:
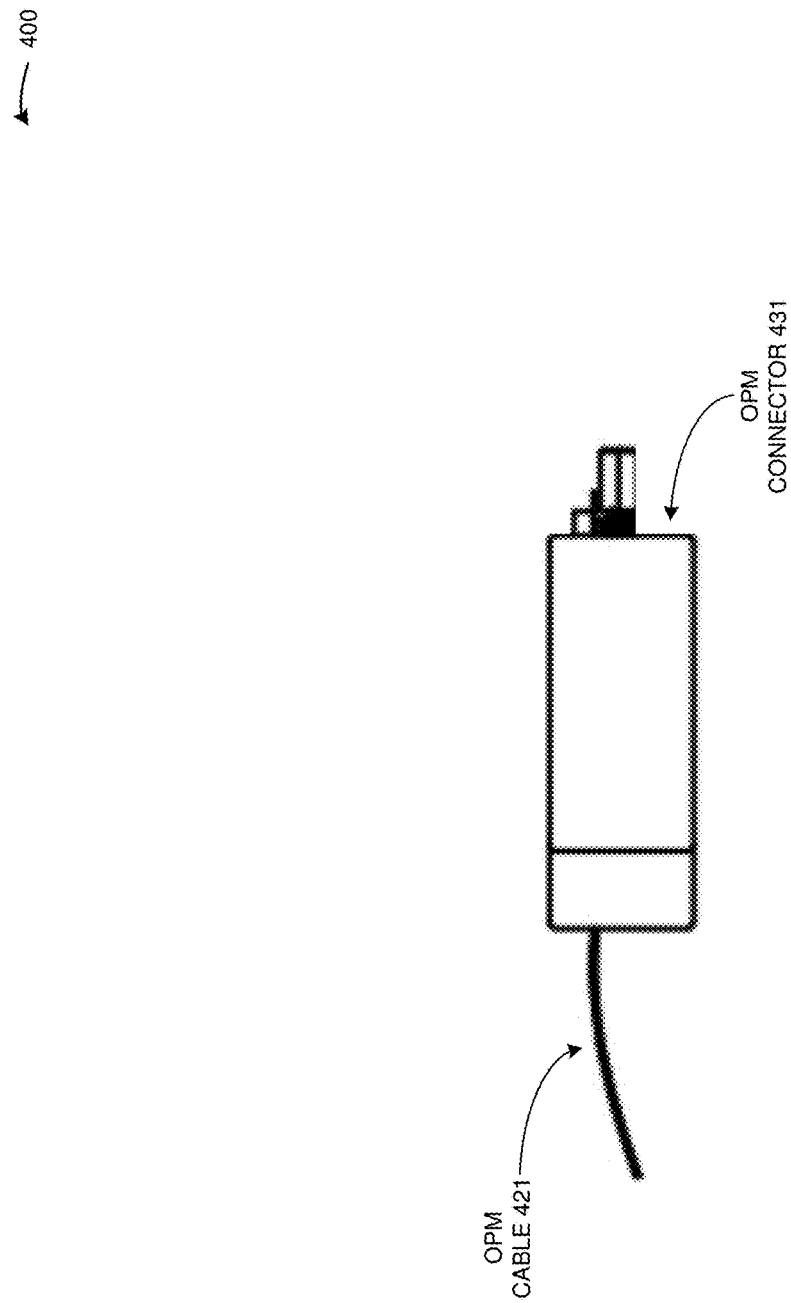
Figure 8:
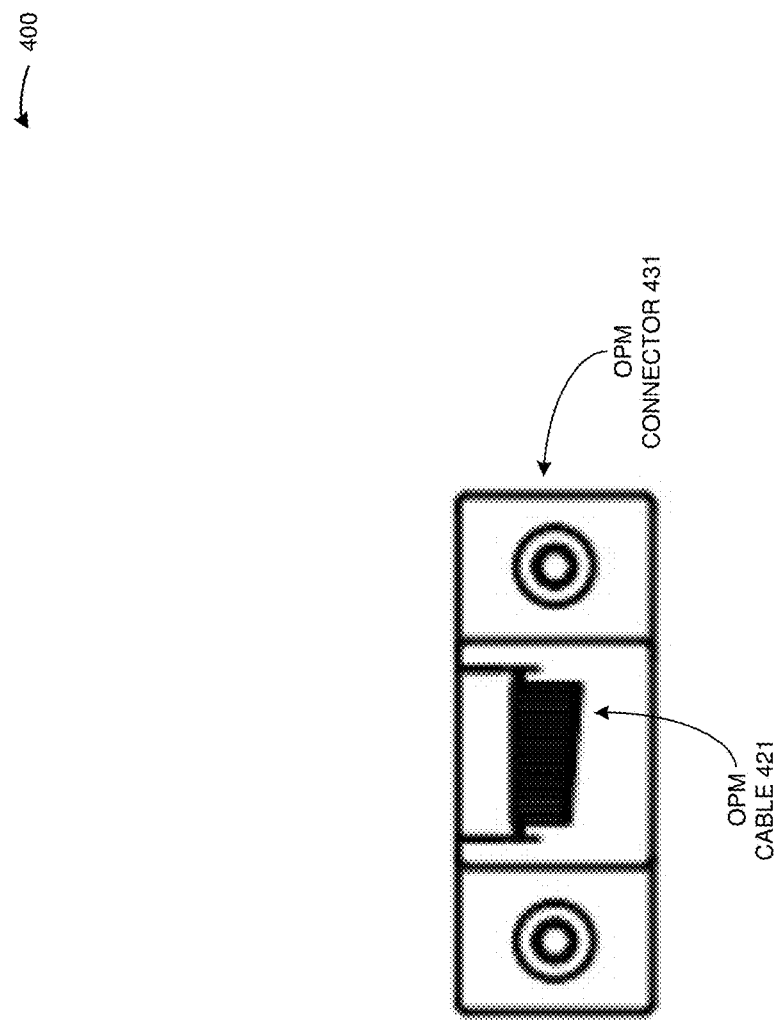

FIGS. 6-8 illustrate OPM connector 431 and OPM cable 421 in OPM MEG system 400. FIG. 6 illustrates a top view of OPM connector 431. FIG. 7 illustrates a side view of OPM connector 431. FIG. 8 illustrates a back view OPM connector 431. OPM connector 431 comprises a casing to house relays 432 and memory 433. The casing may be plastic or some other type of suitable material. The size and shape of the casing is not limited. For example, the casing may comprise a width of 32 millimeters, a depth of 33 millimeters, and a height of 12 millimeters. Metallic interface 434 extends from a front portion of the casing of OPM connector 431 and is configured to detachably couple to metallic interface 444 of OPM controller 441. OPM cable 421 is coupled to a rear portion of the casing of OPM connector 431. OPM cable 421 connects OPM connecter 431 with OPM sensor 411. The specific size and shape of OPM cable 421 is not limited. For example, OPM cable 421 may comprise a flat ribbon cable with a width of 8.5 millimeters and a length of 20 feet.

Figure 9:
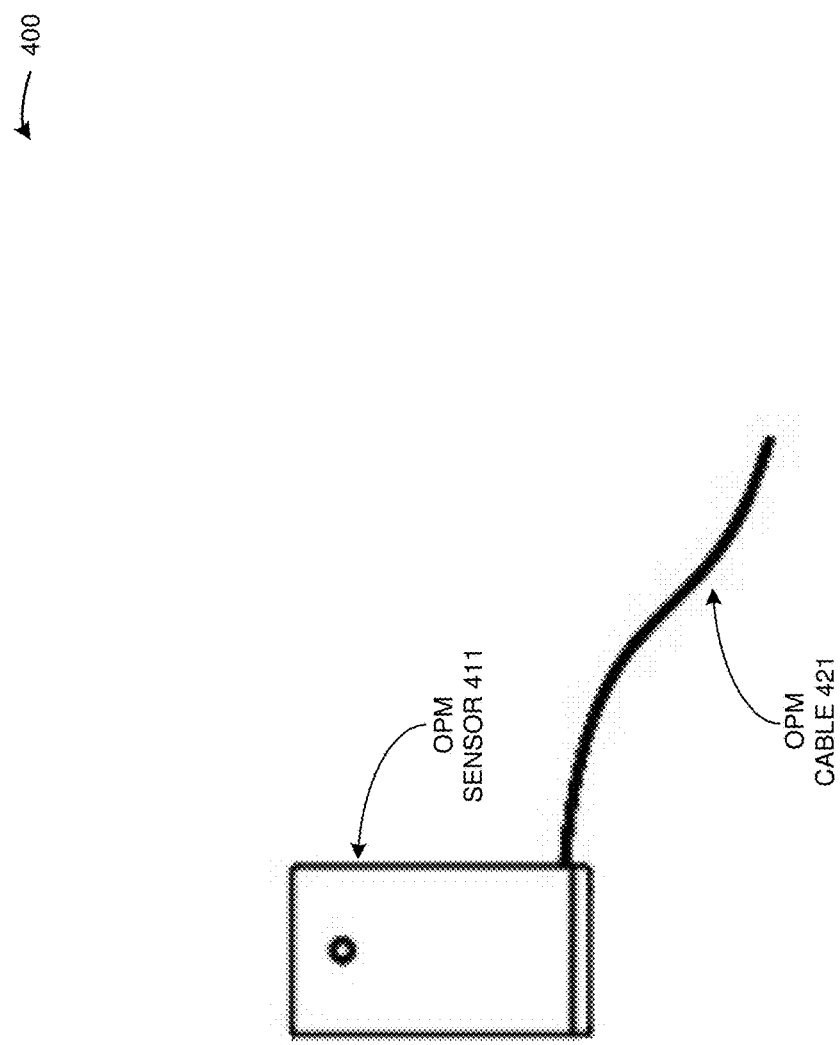
FIG. 9-11 illustrate an OPM sensor in the OPM MEG system.
Figure 10:
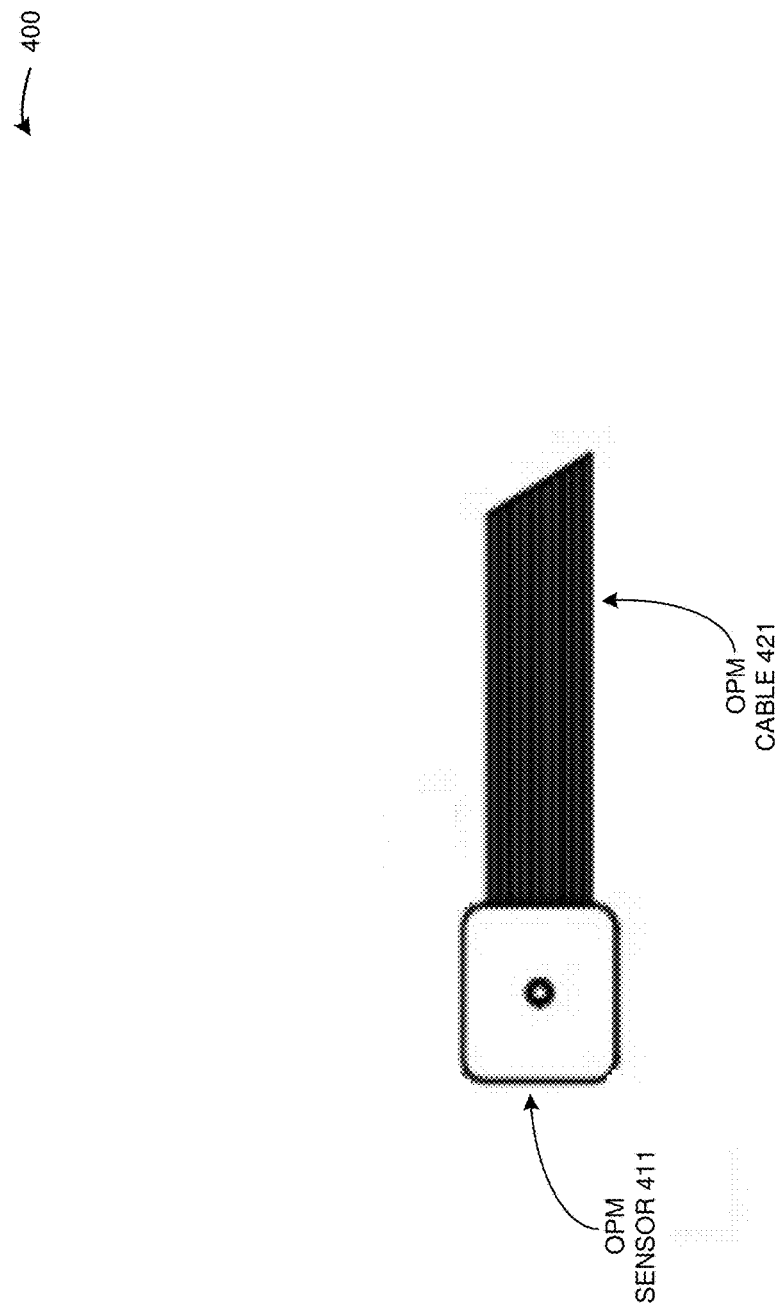
Figure 11:
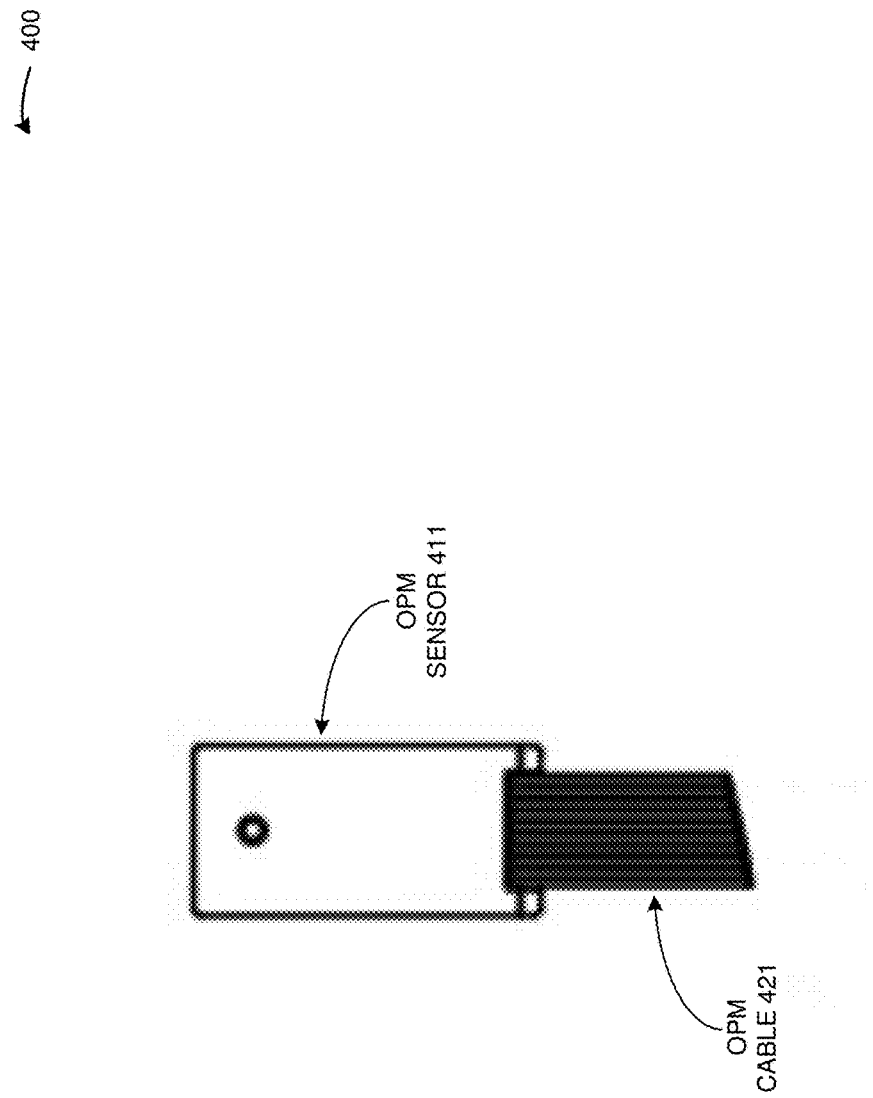

FIGS. 9-11 illustrate OPM sensor 411 and OPM cable 421 in OPM MEG system 400. FIG. 9 illustrates a side view of OPM sensor 411. FIG. 10 illustrates a top view of OPM sensor 411. FIG. 11 illustrates a back view of OPM sensor 411. OPM sensor comprises a casing to house probe laser 412, coils 413, vapor cells 414, pump laser 415, photo detectors 416, and heaters 417. The casing may be plastic or some other type of suitable material that does not interfere with the operation of OPM sensor 411. The size and shape of the casing is not limited. For example, the casing may comprise a width of 13 millimeters, a depth of 15 millimeters, and a height of 26.5 millimeters. OPM cable 421 is coupled to a rear portion of the casing of OPM sensor 411. OPM cable 421 connects OPM sensor 411 to OPM connector 431. The specific size and shape of OPM cable 421 is not limited. For example, OPM cable 421 may comprise a flat ribbon cable with a width of 8.5 millimeters and length of 20 feet. In some examples, OPM sensor 411 is placed in the vicinity of target 401 to measure a magnetetic field emitted by target 401. For example, OPM sensor 411 may be embedded into a helmet worn by target 401 to measure the magnetic field emitted by target 401.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. Thus, the invention is not limited to the specific embodiments described above, but only by the following claims and their equivalents.

What is claimed is:

1. A method of operating an Optically Pumped Magnetometer (OPM) connector that couples an Optically Pumped Magnetometer (OPM) sensor to an OPM controller, the method comprising:

a relay connecting two metallic links in the OPM connector that are coupled to a laser in the OPM sensor;

the relay receiving a control signal from the OPM controller when the OPM connector is coupled to the OPM controller;

the relay disconnecting the two metallic links in the OPM connector that are coupled to the laser in the OPM sensor in response to the control signal from the OPM controller; and the relay connecting the two metallic links that are coupled to the laser in the OPM sensor in response to at least one of a loss of the control signal from the OPM controller and receiving a different control signal from the OPM controller.

2. The method of claim 1 wherein the relay connecting the two metallic links in response to at the loss of the control signal from the OPM controller and/or receiving the different control signal comprises the relay shorting the two metallic links to prevent a buildup of Electrostatic Discharge (ESD).

3. The method of claim 1 wherein:

the relay connecting two metallic links in the OPM connector comprises the relay closing a switch; and the relay disconnecting the two metallic links in the OPM connector comprises the relay opening the switch.

4. The method of claim 1 further comprising a memory storing OPM operational data for the OPM sensor.

5. The method of claim 1 further comprising:

a memory storing OPM operational data; and wherein:

the relay disconnecting the two metallic links in response to the control signal from the OPM controller comprises the OPM controller reading the OPM operational data stored on the memory, generating OPM sensor control signals based on the OPM operational data, and writing addition OPM operational data to the memory.

6. The method of claim 1 further comprising a memory storing OPM operational that indicates a sensor Identifier (ID), configuration parameters, and performance characteristics of the OPM sensor.

7. The method of claim 1 wherein the OPM connector detachably couples to the OPM controller over pin/socket connectors and couples to the OPM sensor over a cable.

8. A method of operating an Optically Pumped Magnetometer (OPM) system to characterize a magnetic field, the OPM system comprising an OPM sensor that is coupled to an OPM cable that is coupled to an OPM connector that is detachably coupled to an OPM controller, the method comprising:
- the OPM connector storing OPM operational data in a memory;
- the OPM controller reading the OPM operational data from the memory in the OPM connector when the OPM connector is coupled to an OPM controller;
- the OPM controller generating sensor control signals based on the OPM operational data and transferring the control signals to the OPM sensor over the OPM connector and the OPM cable;
- the OPM sensor characterizing the magnetic field in response to the sensor control signals and transferring output signals that characterize the magnetic field to the OPM controller over the OPM cable and the OPM connector;
- the OPM controller modeling the magnetic field based on the output signals;
- the OPM controller transferring new OPM operational data to the OPM connector; and
- the OPM connector storing the new OPM operational data in the memory.

9. The method of claim 8 further comprising:
the OPM controller transferring connector control signals to the OPM connector; and
the OPM connector receiving the connector control signals and responsively opening a relay to communicatively couple the OPM controller to the OPM sensor.

10. The method of claim 8 further comprising:
the OPM controller transferring connector control signals to the OPM connector; and
the OPM connector receiving the connector control signals and responsively closing a relay to communicatively decouple the OPM controller from the OPM sensor.

11. The method of claim 8 further comprising the OPM connector detaching from the OPM controller and responsively closing a relay to prevent a buildup of Electrostatic Discharge (ESD) in the OPM connector.

12. The method of claim 8 further comprising:
the OPM controller transferring connector control signals to the OPM connector;
the OPM connector receiving the connector control signals and responsively disconnecting two metallic links in the OPM connector to communicatively couple the OPM controller to the OPM sensor; and
the OPM connector detaching from the OPM controller and responsively connecting the two metallic links in the OPM connector to prevent a buildup of Electrostatic Discharge (ESD) in the OPM connector.

13. The method of claim 8 wherein the OPM connector storing the OPM operational data in the memory comprises the storing OPM operational data that indicates a sensor Identifier (ID), configuration parameters, and performance characteristics of the OPM sensor.

14. The method of claim 8 wherein:
the OPM controller transferring the new OPM operational data to the OPM connector comprises generating the new OPM data based on the output signals and transferring the new OPM data to the OPM connector; and
wherein:
the new OPM operational data indicates updated configuration parameters and updated performance characteristics of the OPM sensor.

15. An Optically Pumped Magnetometer (OPM) system comprising an OPM sensor that is coupled to an OPM cable that is coupled to an OPM connector that is detachably coupled to an OPM controller and that is configured to characterize a magnetic field, the OPM system comprising:
- the OPM connector configured to store OPM operational data in a memory;
- the OPM controller configured to read the OPM operational data from the memory in the OPM connector when the OPM connector is coupled to an OPM controller;
- the OPM controller configured to generate sensor control signals based on the OPM operational data and transfer the sensor control signals to the OPM sensor over the OPM connector and the OPM cable;
- the OPM sensor configured to characterize the magnetic field in response to the sensor control signals and transfer output signals that characterize the magnetic field to the OPM controller over the OPM cable and the OPM connector;
- the OPM controller configured to model the magnetic field based on the output signals;
- the OPM controller configured to transfer new OPM operational data to the OPM connector; and
- the OPM connector configured to store the new OPM operational data in the memory.

16. The OPM system claim 15 further comprising:
the OPM controller configured to transfer connector control signals to the OPM connector; and
the OPM connector configured to receive the connector control signals and responsively open a relay to communicatively couple the OPM controller to the OPM sensors.

17. The OPM system claim 15 further comprising:
the OPM controller configured to transfer connector control signals to the OPM connector; and
the OPM connector configured to receive the connector control signals and responsively close a relay to communicatively decouple the OPM controller from the OPM sensors.

18. The OPM system claim 15 further comprising the OPM connector configured to detach from the OPM controller and responsively close a relay to prevent a buildup of Electrostatic Discharge (ESD) in the OPM connector.

19. The OPM system claim 15 further comprising:
the OPM controller configured to transfer connector control signals to the OPM connector;
the OPM connector configured to receive the connector control signals and responsively disconnect two metallic links in the OPM connector to communicatively couple the OPM controller to the OPM sensors; and
the OPM connector configured to detach from the OPM controller and responsively connect the two metallic links in the OPM connector to prevent a buildup of Electrostatic Discharge (ESD) in the OPM connector.

20. The OPM system claim 15 wherein the OPM connector is configured to store the OPM operational data in the memory comprises the OPM connector configured to store OPM operational data that indicates a sensor Identifier (ID), configuration parameters, and performance characteristics of the OPM sensor.

* * * * *